United States Patent
Yang et al.

(10) Patent No.: US 10,627,441 B2
(45) Date of Patent: Apr. 21, 2020

(54) APPARATUS FOR TESTING SEMICONDUCTOR PACKAGE

(71) Applicant: SAMSUNG ELECTRONICS CO., LTD., Suwon-si, Gyeonggi-do (KR)

(72) Inventors: Dong-sin Yang, Asan-si (KR); Min-kyun Sun, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 421 days.

(21) Appl. No.: 15/483,088

(22) Filed: Apr. 10, 2017

(65) Prior Publication Data
US 2018/0038905 A1 Feb. 8, 2018

(30) Foreign Application Priority Data

Aug. 5, 2016 (KR) .................. 10-2016-0100123

(51) Int. Cl.
*G01R 31/26* (2020.01)
*G01R 31/28* (2006.01)

(52) U.S. Cl.
CPC ..... *G01R 31/2601* (2013.01); *G01R 31/2867* (2013.01); *G01R 31/2874* (2013.01); *G01R 31/2875* (2013.01); *G01R 31/2877* (2013.01)

(58) Field of Classification Search
CPC ............ G01R 31/2856; G01R 31/2875; G01R 31/2877
See application file for complete search history.

(56) References Cited

U.S. PATENT DOCUMENTS

| | | | |
|---|---|---|---|
| 7,619,427 B2 | 11/2009 | Ando et al. | |
| 2005/0200376 A1* | 9/2005 | Yee | G01R 31/2875 324/750.01 |
| 2012/0313657 A1 | 12/2012 | Nakamura | |
| 2013/0285686 A1* | 10/2013 | Malik | G01R 31/2875 324/750.05 |
| 2014/0354312 A1 | 12/2014 | Li et al. | |
| 2015/0137842 A1* | 5/2015 | Murakami | G01R 1/067 324/750.03 |
| 2016/0041202 A1 | 2/2016 | Peng et al. | |
| 2016/0109510 A1 | 4/2016 | Vincent et al. | |

FOREIGN PATENT DOCUMENTS

| | | |
|---|---|---|
| KR | 10-2003-0078198 A | 10/2003 |
| KR | 10-2007-0035280 A | 3/2007 |
| KR | 10-2016-0007999 A | 1/2016 |

* cited by examiner

*Primary Examiner* — Tung X Nguyen
(74) *Attorney, Agent, or Firm* — Lee IP Law, P.C.

(57) ABSTRACT

A semiconductor package test apparatus includes a handler, a test board, and a board temperature controller. The handler includes a first heater and cooler to heat and cool a semiconductor package. The test board tests the semiconductor package, and includes main test board having a test socket and a base test board spaced from the main test board. The board temperature controller includes a second heater and cooler to heat and cool the main test board.

20 Claims, 15 Drawing Sheets

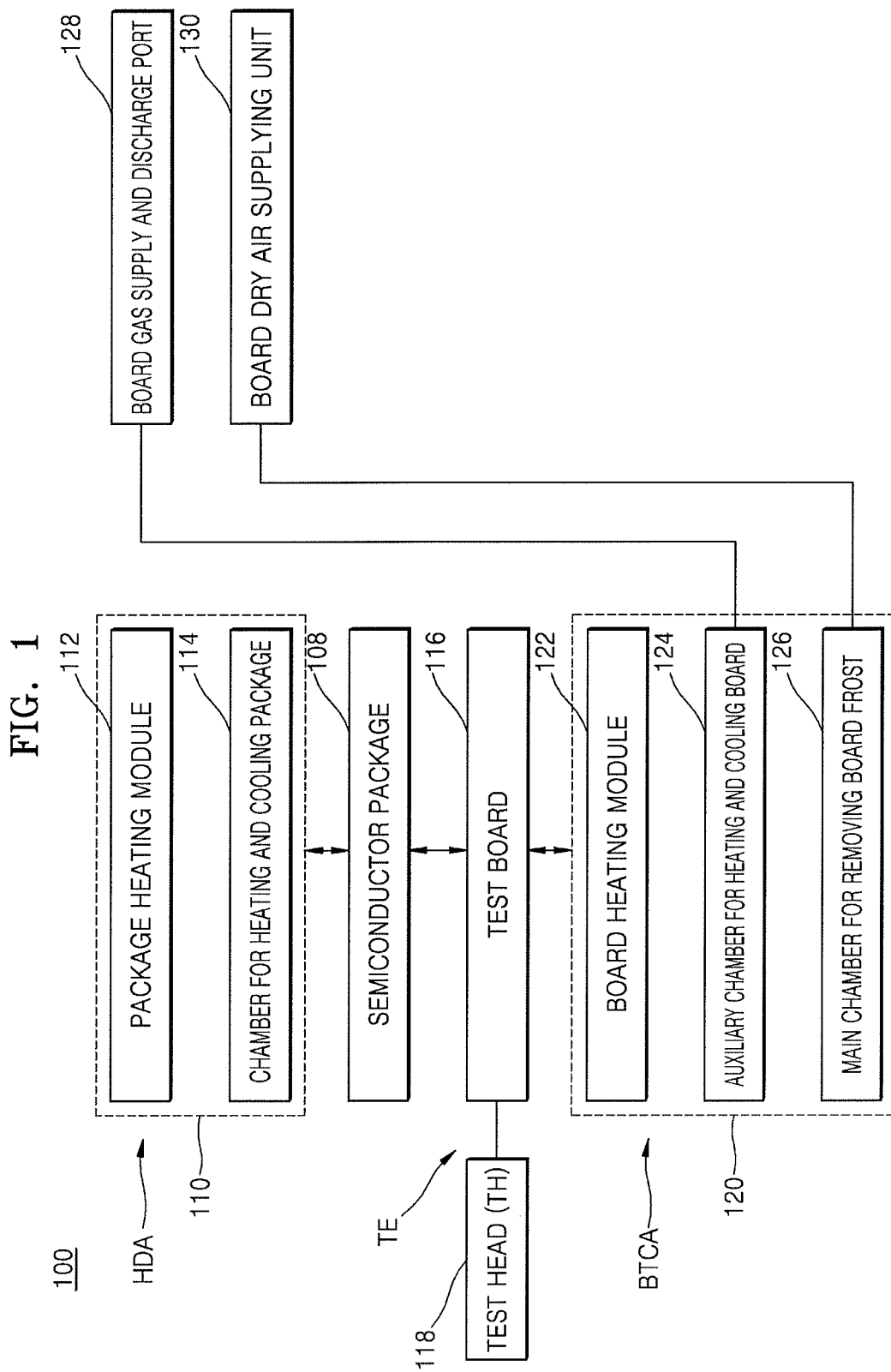

APPARATUS FOR TESTING SEMICONDUCTOR PACKAGE

CROSS-REFERENCE TO RELATED APPLICATION

Korean Patent Application No. 10-2016-0100123, filed on Aug. 5, 2016, and entitled, "Apparatus for Testing Semiconductor Package," is incorporated by reference herein in its entirety.

BACKGROUND

1. Field

One or more embodiments described herein relates to an apparatus for testing a semiconductor package.

2. Description of the Related Art

Various systems have been developed to test semiconductor packages for defects at the manufacturing stage. These systems test the semiconductor packages at temperatures different from temperatures the packages are expected to experience during actual use, for example, as a result of heat transfer or heat loss. Consequently, the reliability of the testing results may not be accurate.

SUMMARY

In accordance with one or more embodiments, a semiconductor package test apparatus includes a handler including a first heater and cooler to heat and cool a semiconductor package; a test board including main test board having a test socket and a base test board spaced from the main test board, the test board to test the semiconductor package connected to the test socket; and a board temperature controller including a second heater and cooler to heat and cool the main test board.

In accordance with one or more other embodiments, a semiconductor package test apparatus includes a first heater and cooler to heat and cool a semiconductor package; a test board at a lower part of the semiconductor package, the test board including a main test board having a test socket to connect to the semiconductor package and a base test board spaced from a lower part of the main test board; and a second heater and cooler between the main test board and the base test board, the second heater and cooler to heat or cool the main test board to a first temperature.

In accordance with one or more other embodiments, an apparatus a link to a semiconductor package; and an adjuster to control a temperature of a test board for testing the semiconductor package, wherein the test board is coupled to the semiconductor package through the link and wherein the second adjuster is to offset a change in temperature of the test board during testing.

BRIEF DESCRIPTION OF THE DRAWINGS

Features will become apparent to those of skill in the art by describing in detail exemplary embodiments with reference to the attached drawings in which:

FIG. 1 illustrates an embodiment of a semiconductor package test apparatus;

DETAILED DESCRIPTION

Figure 2A:
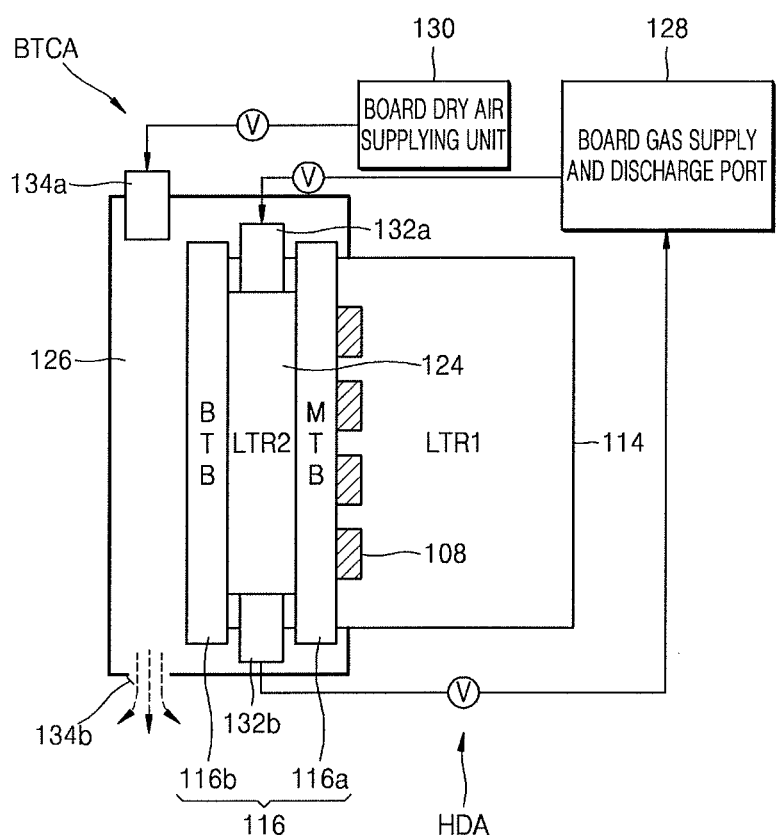
FIGS. 2A and 2B illustrate examples of side cross-sectional views of the semiconductor package test apparatus.

FIG. 1 illustrates an embodiment of a semiconductor package test apparatus 100 for testing electrical characteristics of a semiconductor package 108. The semiconductor package 108 may include, for example, a volatile memory package such as a static RAM (SRAM) package, a dynamic RAM (DRAM) package, or a synchronous DRAM (SDRAM) package. The semiconductor package 108 may include, for example, a non-volatile memory package such as a read only memory (ROM) package, a programmable ROM (PROM) package, an electrically programmable ROM (EPROM) package, an electrically erasable and programmable ROM (EEPROM) package, a flash memory package, a phase-change RAM (PRAM) package, a magnetic RAM (MRAM) package, a resistive RAM (RRAM) package, or a ferroelectric RAM (FRAM) package. The semiconductor package 108 may have connection terminals (e.g., solder balls) regardless of package type.

The semiconductor package test apparatus 100 may include a handler apparatus HDA, a tester TE, and a board temperature controlling apparatus BTCA. The handler apparatus HDA may electrically connect the semiconductor package 108 to the tester TE and may inspect the semiconductor package 108 according to test results.

The handler apparatus HDA may include a package heating and cooling unit 110 for heating or cooling the semiconductor package 108. The package heating and cooling unit 110 may include a package heating module 112 attached to the semiconductor package 108 for directly heating the semiconductor package 108. In one embodiment, the package heating and cooling unit 110 may include a package heating and cooling chamber 114 that indirectly heats or cools the semiconductor package 108. The package heating and cooling chamber 114 may be used to test the semiconductor package 108.

The tester TE may include a test head (TH) 118 linked to the handler apparatus HDA and a test board 116 equipped with the test head 118. The test board 116 may include a main test board having a test socket and a base test board separate from the main test board. The semiconductor package 108 may be connected to the test socket. The test board 116 may be a print circuit board. The test board 116 may include resistors, capacitors, inductor, and/or other circuit elements.

The board temperature controlling apparatus BTCA controls the temperature of the test board 116 to control a set temperature of the handler apparatus HDA (e.g., a temperature applied to the semiconductor package 108) and a test temperature of the semiconductor package 108. The board temperature controlling apparatus BTCA may include a board heating and cooling unit 120 for heating or cooling the test board 116, e.g., a main test board.

The board heating and cooling unit 120 may include a board heating module 122 attached to a lower surface of the test board 116 (e.g., the main test board) for directly heating the main test board. The board heating and cooling unit 120 may include a board heating and cooling auxiliary chamber 124 that indirectly heats or cools the test board 116, e.g., the main test board. A board gas supply and discharge unit 128 for supplying and discharging heating gas and cooling gas may be connected to the board heating and cooling auxiliary chamber 124.

The board heating and cooling unit 120 may further include a board frost-removing main chamber 126. A board dry air supply unit 130 that supplies dry air may be connected to the board frost-removing main chamber 126. The board gas supply and discharge unit 128 and the board dry air supply unit 130 may be in the handler apparatus HDA or may be outside the handler apparatus HDA. The board gas supply and discharge unit 128 and the board dry air supply unit 130 may be understood as a configuration in, for example, the board temperature controlling apparatus BTCA.

The semiconductor package 108 may be heated or cooled to a first temperature by the package heating and cooling unit 110. For example, the semiconductor package 108 may be heated or cooled to a semiconductor package test temperature (e.g., the first temperature) by the package heating and cooling unit 110.

The first temperature may be a high temperature. For example, in one embodiment the first temperature may be a high temperature (e.g., 85° C.) or in a high temperature range, for example, about 85° C. to about 105° C. In one embodiment, the first temperature may be a low temperature. For example, in one embodiment, the first temperature may be a low temperature (e.g., −5° C.) or in a low temperature range, e.g., about −40° C. to about −5° C. In other embodiments, the first temperature may be a different temperature depending, for example, on expected temperature conditions when in actual use and/or based on the type of circuits in the semiconductor package.

In addition, the test board 116 (e.g., the main test board) may be heated or cooled to the same temperature as the first temperature by the board heating and cooling unit 120. Heat may transfer, for example, as shown by arrows between the semiconductor package 108 and the package heating and cooling unit 110 in FIG. 1. In one embodiment, heat may transfer, for example, as shown by arrows between the semiconductor package 108 and the board heating and cooling unit 120 in FIG. 1.

When the test board 116 is heated or cooled by the board temperature controlling apparatus BTCA, the semiconductor package test apparatus 100 may have a test temperature of the semiconductor package 108 that is the same as a set temperature set on the handler apparatus 100 by the board temperature controlling apparatus BTCA. For example, when the temperature of the test board 116 deviates from the test temperature during testing, the semiconductor package test apparatus 100 supplies heat to the test board 116 to increase a temperature of the semiconductor package 108 back up to the test temperature. As a result, an actual test temperature of the semiconductor package 108 may be accurately determined, and test reliability of the semiconductor package 108 may improved.

In comparison, when the temperature of the test board 116 is not controlled (e.g. if the board temperature controlling apparatus BTCA is omitted), heat may be released outside of the semiconductor package 108 through the test board 116 or may enter the semiconductor package 108 through the test board 116 from the outside. In this case, the test temperature of the semiconductor package 108 set by the handler apparatus HDA is higher or lower than the set temperature and reliability may deteriorate.

Figure 2B:
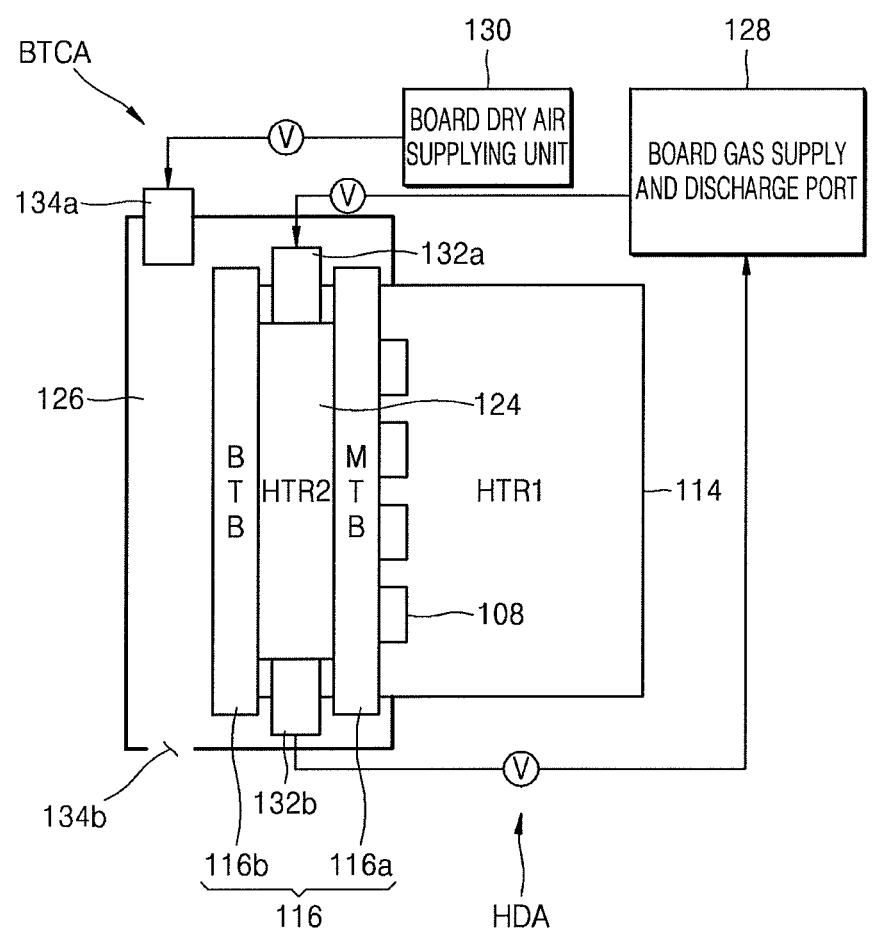

FIGS. 2A and 2B illustrate an embodiment of side cross-sectional views of a structure and driving state of semiconductor package test apparatus 100. In particular, FIG. 2A illustrates a low-temperature test of the semiconductor package 108. FIG. 2B illustrates a high-temperature test of the semiconductor package 108.

Referring to FIG. 2A, the handler apparatus HDA of the semiconductor package test apparatus 100 sets a temperature of the package heating and cooling chamber 114 (a test chamber) to a low temperature LTR1, for example, −10° C. or lower. Accordingly, the semiconductor package 108 may not be maintained at a low temperature state.

Referring to FIG. 2B, the handler apparatus HDA of the semiconductor package test apparatus 100 sets a temperature of the package heating and cooling chamber 114 (a test chamber) to a high temperature HTR1, for example, 80° C. or higher. Accordingly, the semiconductor package 108 may not be maintained at a high temperature state.

The semiconductor package 108 is connected to the test board 116 and tested. The test board 116 may include a main test board 116a (MTB) having a test socket and a base test board 116b (BTB) separate from the main test board 116a. The board heating and cooling auxiliary chamber 124, for indirectly heating or cooling the main test board 116a, may be between the main test board 116a and the base test board 116b. The board heating and cooling auxiliary chamber 124 may be in the board temperature controlling apparatus BTCA that controls a temperature of the test board 116. An inlet 132a and an outlet 132b, through which heating gas and cooling gas may be supplied and discharged, may be on the board heating and cooling auxiliary chamber 124.

A board gas supply and discharge unit 128, for supplying and discharging heating gas or cooling gas, may be connected to the inlet 132a and the outlet 132b of the board heating and cooling auxiliary chamber 124. The heating gas or cooling gas supplied by the board gas supply and discharge unit 128 may be turned on or off by a valve V on a gas supply and discharge pipe. The heating gas may be, for example, heated air. The cooling gas may be, for example, liquid nitrogen gas.

As shown in FIG. 2A, the board heating and cooling auxiliary chamber 124 may have a low temperature LTR2. In one embodiment, LTR2 and LTR1 may be almost the same. As shown in FIG. 2B, the board heating and cooling auxiliary chamber 124 may have a high temperature HTR2. In one embodiment, HTR2 and HTR1 may be almost the same. As a result, the semiconductor package test apparatus 100 may set a set temperature of the handler apparatus HDA to be the same with an actual test temperature of the semiconductor package 108. Thus, test reliability of the semiconductor package 108 may be improved.

The semiconductor package test apparatus 100 may further include a board frost-removing main chamber 126 that includes a base test board 116b, a main test board 116a, and a board heating and cooling auxiliary chamber 124. In FIGS. 2A and 2B, the board frost-removing main chamber 126 includes all of the base test board 116b, the main test board 116a, and the board heating and cooling auxiliary chamber 124. In one embodiment, the board frost-removing main chamber 126 may cover one side of the base test board 116b. The board frost-removing main chamber 126 may be in the board temperature controlling apparatus BTCA to control the temperature of the test board 116.

A board dry air supply unit 130 that supplies and discharges dry air may be connected to an inlet 134a and an outlet 134b of the board frost-removing main chamber 126. The dry air may or may not be supplied by the board dry air supply unit 130 by using a valve V on an air supply and discharge pipe. As shown in FIG. 2A, the dry air supplied to the board frost-removing main chamber 126 may be supplied to a lower surface of the base test board 116b to remove frost (or condensation) formed due to a temperature difference between the base test board 116b and its periphery.

Figure 3A:
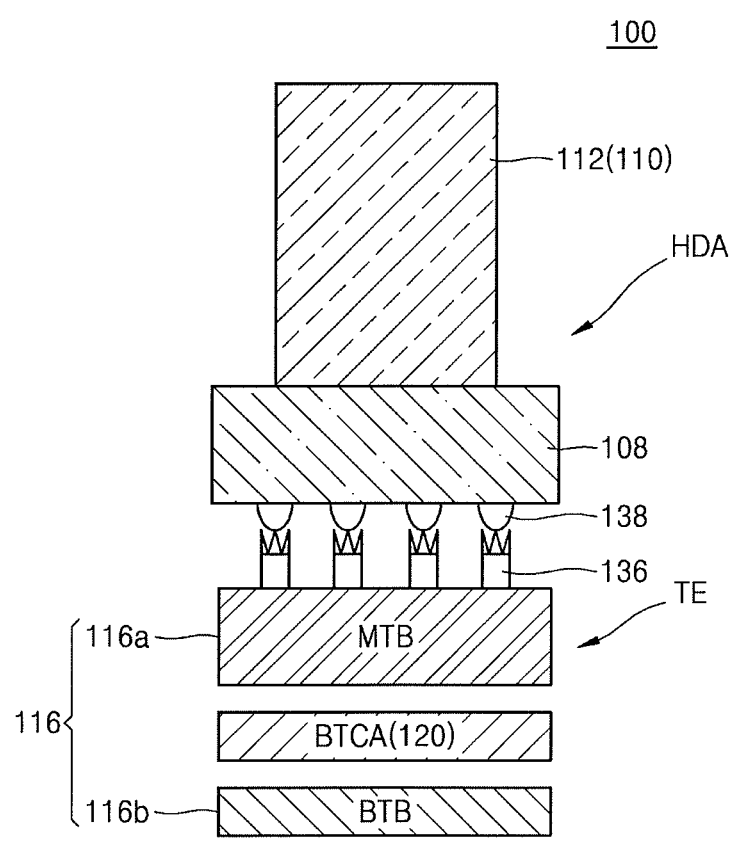
FIGS. 3A and 3B illustrate embodiments of a connection between a test board and a semiconductor package of the semiconductor package test apparatus.
Figure 3B:
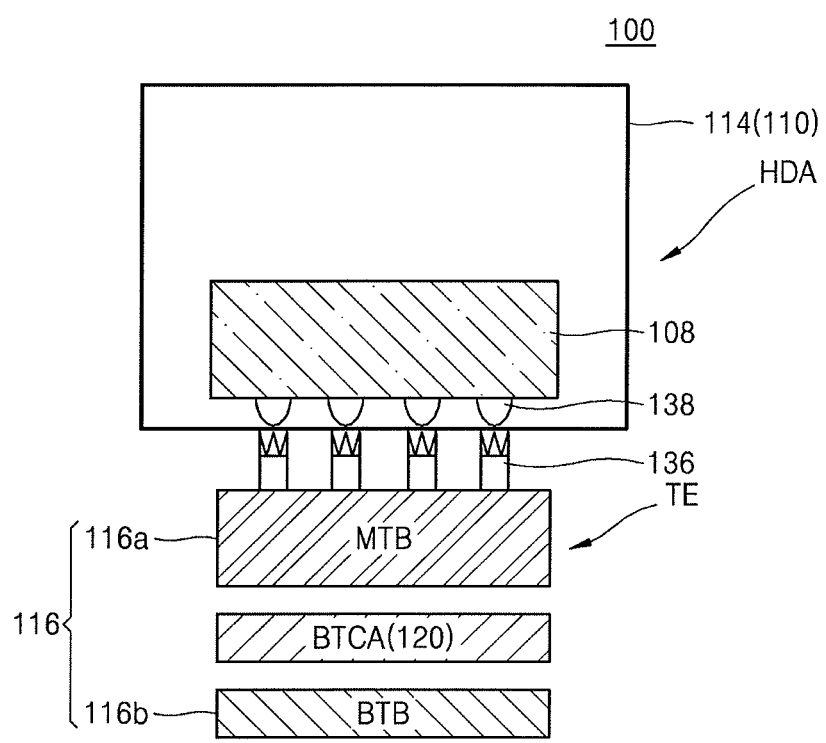

FIGS. 3A and 3B are cross-sectional views that illustrate embodiments of a connection between a test board and a semiconductor package of the semiconductor package test apparatus 100. As previously indicated, the semiconductor package test apparatus 100 may include a handler apparatus HDA, a tester TE, and a board temperature controlling apparatus BTCA. The handler apparatus HDA in FIG. 3A may include a package heating module 112 as a package heating and cooling unit 110 for heating or cooling a semiconductor package 108. The package heating module 112 may be attached to the semiconductor package 108 to directly heat the semiconductor package 108.

The handler apparatus HDA in FIG. 3B may include a package heating and cooling chamber 114 as a package heating and cooling unit 110 for heating or cooling a semiconductor package 108. As described above, the package heating and cooling chamber 114 may indirectly heat or cool the semiconductor package 108 and may be a test chamber in which the semiconductor package 108 is tested.

The semiconductor package 108 may be tested by being connected to the tester TE. A connection terminal 138 of the semiconductor package 108 may be connected to a test board 116 corresponding to the tester TE. The connection terminal 138 of the semiconductor package 108 may be connected to a test socket 136 on the main test board 116a. As described above, the test board 116 may include the main test board 116a having test sockets 136 on an upper surface of the main test board 116a, and a base test board 116b spaced apart from the main test board 116a.

The board temperature controlling apparatus BTCA, for controlling the temperature of the main test board 116a, may be between the main test board 116a and the base test board 116b. The board temperature controlling apparatus BTCA may include a board heating and cooling unit 120. As described above, the board heating and cooling unit 120 may include a heating module (e.g., 122 of FIG. 1) and an auxiliary chamber (e.g., 124 of FIGS. 1, 2A, and 2B).

Figure 4A:
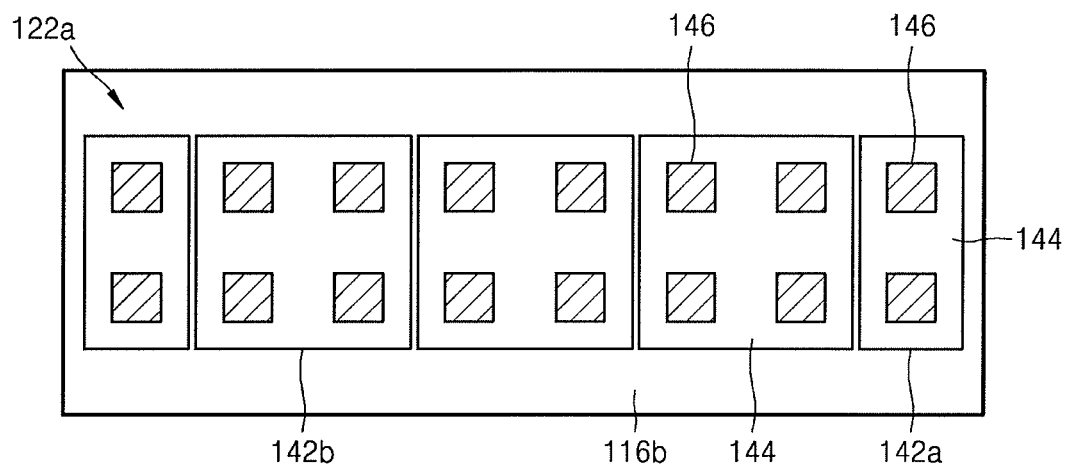
FIGS. 4A to 4C illustrate embodiments of a board heating module.
Figure 4B:
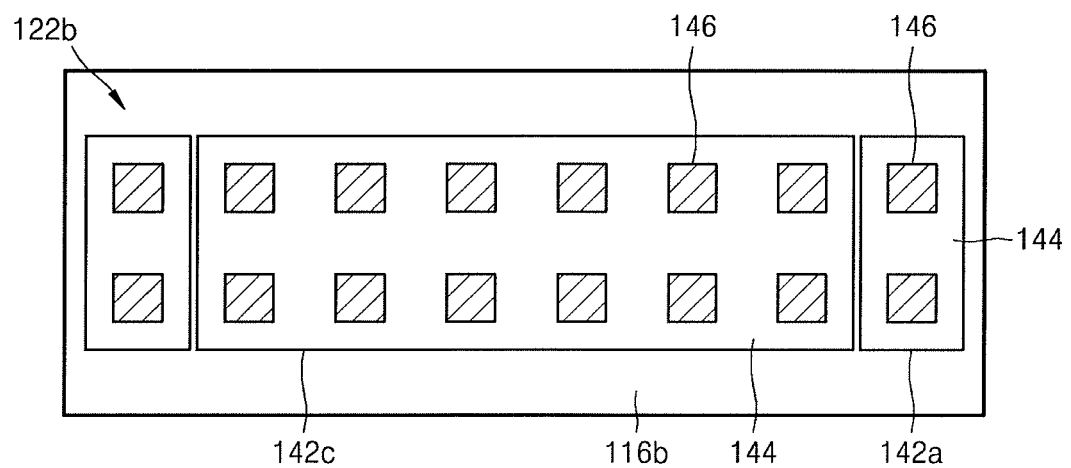
Figure 4C:
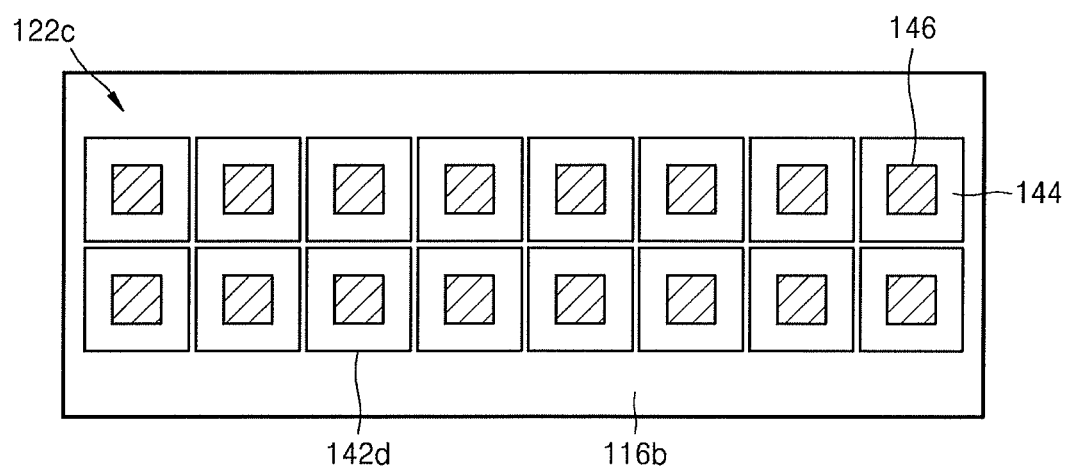

FIGS. 4A to 4C illustrate embodiments of a board heating module 122a, 122b, and 122c corresponding to the board heating and cooling unit (e.g., 120 of FIGS. 1, 3A, and 3B) of the semiconductor package test apparatus 100. The board heating module may be connected and equipped on a base test board 116b.

Referring to FIG. 4A, the board heating module 122a may include heater modules 142a and 142b on a heater module body unit 144 and spaced apart from each other. The heater module 142a may include two heaters on the heater module body unit 144 and spaced apart from each other. The heater module 142b may include four heaters 146 on the heater module body unit 144 and spaced apart from each other. In one embodiment, the board heating module 122a may include three heater modules 142b and two heater modules 142a.

Referring to FIG. 4B, the board heating module 122b may include heater modules 142a and 142c on a heater module body unit 144 and spaced apart from each other. The heater module 142a may be the same as that illustrated in FIG. 4A. The heater module 142c may include twelve heaters 146 on the heater module body unit 144 and spaced apart from each other. In one embodiment, the board heating module 122b may include one heater module 142c and two heater modules 142a.

Referring to FIG. 4C, the board heating module 122c may include heater modules 142d on a heater module body unit 144 and spaced apart from each other. The heater module 142d may include one heater 146 on the heater module body unit 144. In one embodiment, board heating module 122c may include sixteen heater modules 142d.

The board heating modules 122a, 122b, and 122c may control the heating temperature of the heater modules 142a, 142b, 142c, and 142d. The temperature of the main test board (e.g., 116a of FIGS. 3A and 3B) on the heater modules 142a, 142b, 142c, and 142d may be independently controlled in predetermined regions.

Figure 5A:
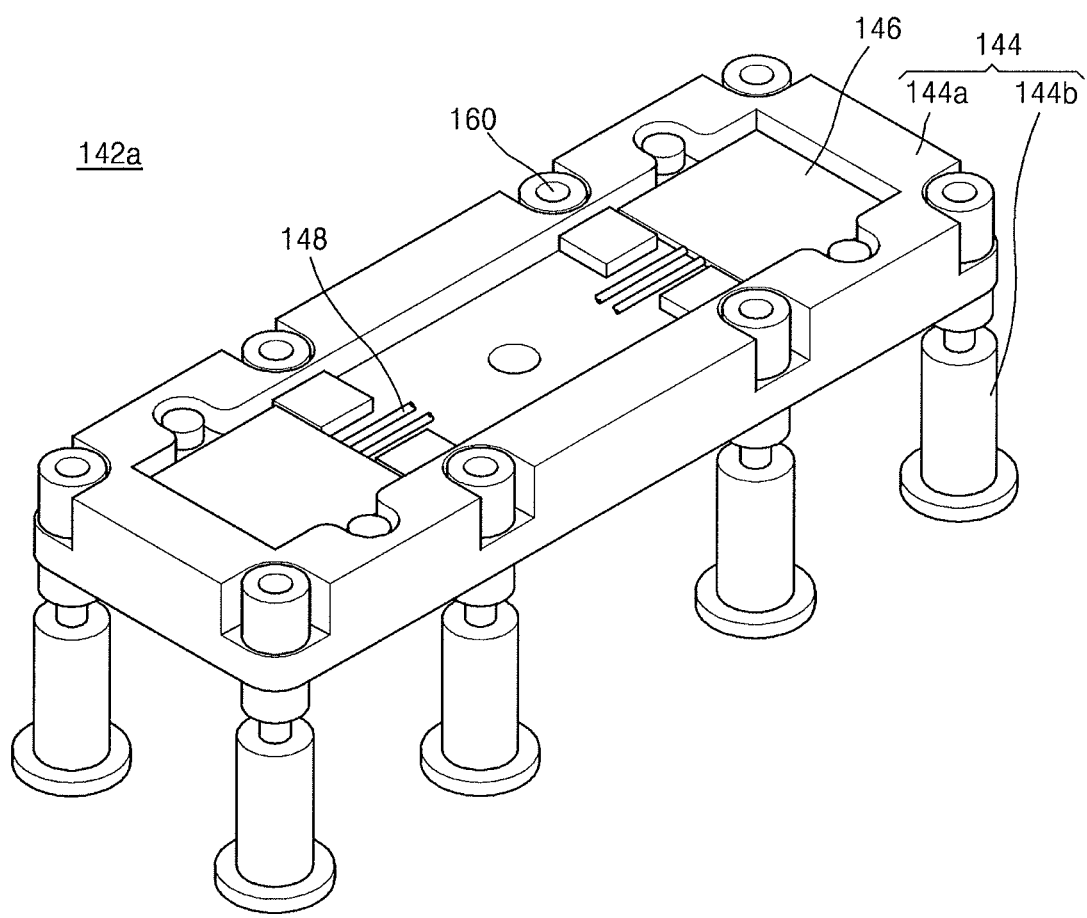
FIGS. 5A and 5B illustrate embodiments of a heater module.
Figure 5B:
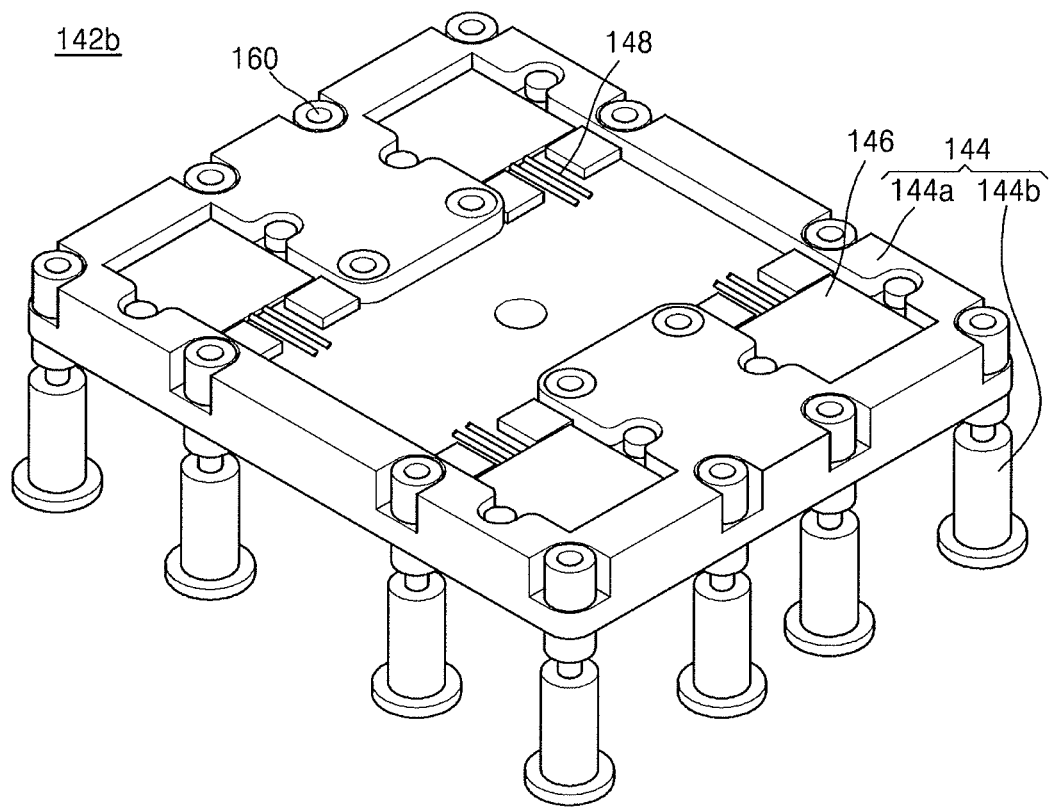

FIGS. 5A and 5B illustrate embodiments of a heater module corresponding to a board heating module of the semiconductor package test apparatus 100. In particular, FIGS. 5A and 5B illustrate heater modules 142a and 142b that correspond to board heating modules (e.g., 122a and 122b of FIGS. 4A and 4B, respectively). In FIG. 5A, the heater module 142a may include two heaters 146 on a heater module body unit 144 and spaced apart from each other. In FIG. 5B, the heater module 142b may include four heaters 146 on a heater module body unit 144 and spaced apart from each other.

The heater module body unit 144 may include a heater module bridge 144b connected to a heater module base 144a and may be connected to a test board (e.g., 116 of FIGS. 3A and 3B). Power lines 148 connected to the heater 146 may be on the heater module base 144a. The heater module bridge 144b may have a coupling hole 160 to be connected with the test board 116 in the heater module bridge 144b. In this regard, each of the heater modules 142a and 142b may have at least one (and in some embodiments, for example, two to/or four, heaters 146) and may control the temperature of the main test board 116a by heating the main test board 116a (e.g., of FIGS. 3A and 3B).

Figure 6:
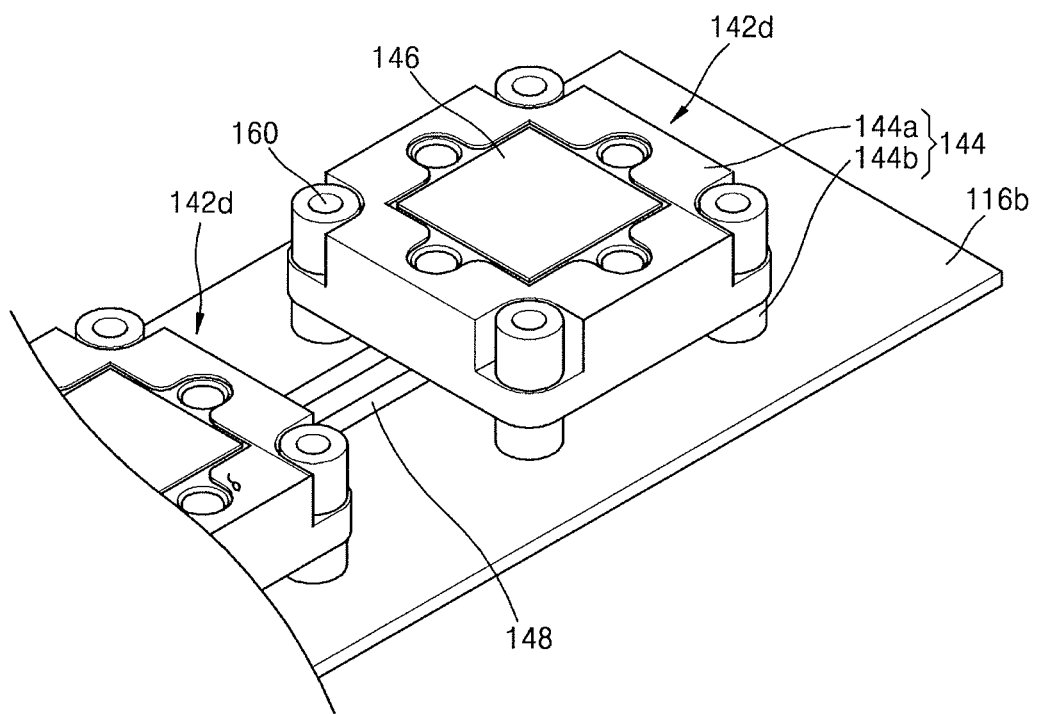
FIGS. 6 and 7 illustrate an embodiment of a connection between a heater module and a test board of the semiconductor package test apparatus.
Figure 7:
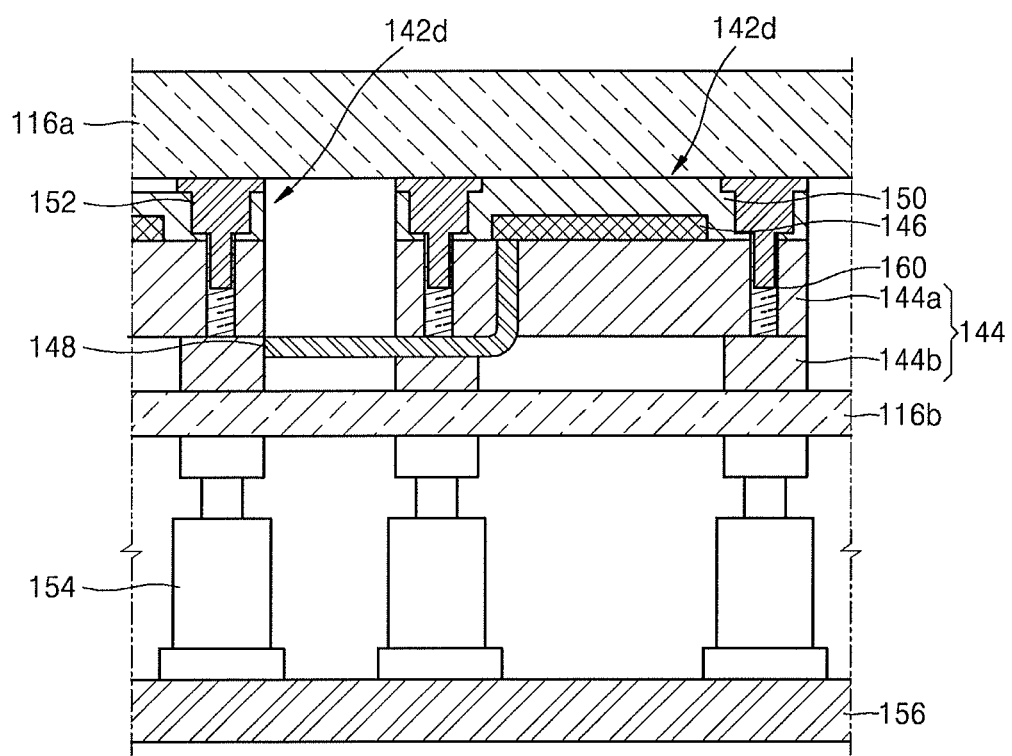

FIGS. 6 and 7 illustrate an embodiment of a connection between a heater module and a test board of the semiconductor package test apparatus 100. FIG. 6 is a perspective view of the heater module 142d connected on the base test board 116b. FIG. 7 is a cross-sectional view that illustrates the connection between the heater module 142d and the test board 116 including the main test board 116a and the base test board 116b.

Referring to FIGS. 6 and 7, two heater modules 142d are on and connected to the base test board 116b. The heater module 142d may include one heater 146 on the heater module body unit 144. A heat transferring member 150 in contact with the main test board 116a may be on the heater 146. The heat transferring member 150 may be formed, for example, of a metal material.

The heater module body unit 144 may include the heater module bridge 144b on the heater module base 144a. Power lines 148, linked to the heater 146 and connected to a neighboring heater module 142b, may be on the heater module base 144a. The coupling hole 160 to be connected with the test board 116 may be in the heater module bridge 144b. As shown in FIG. 7, the main test board 116a is on the heater module 142d. The main test board 116a and the heater modules 142d are coupled by a coupling member 152. The base test board 116b may be connected to a supporting member 156 by a linking bridge 154. In this regard, the heater module 142d may have one heater 146 and may control a temperature of the main test board 116a by directly heating the main test board 116a.

Figure 8:
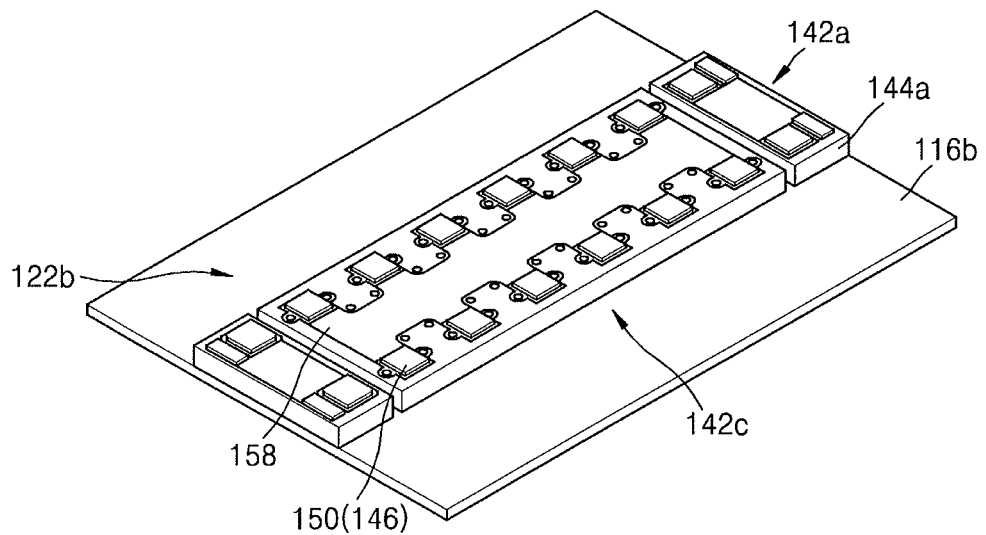
FIGS. 8 and 9 illustrate am embodiment of a board heating module.
Figure 9:
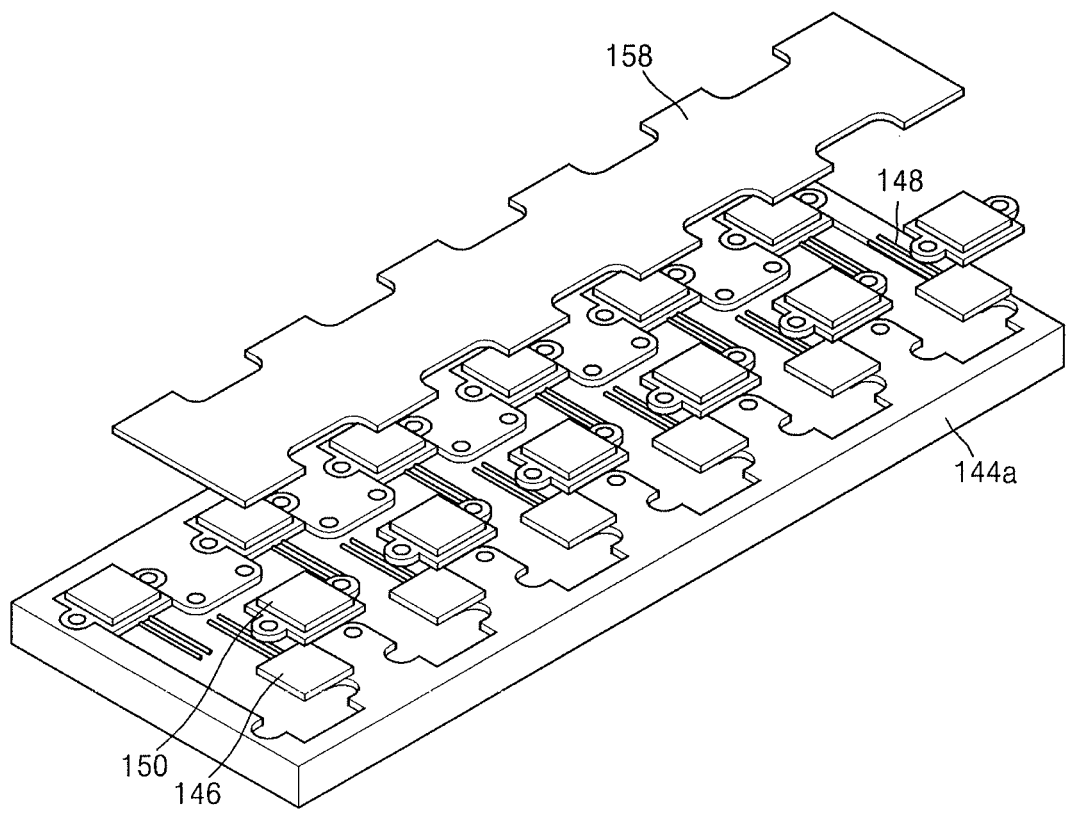

FIGS. 8 and 9 illustrate an embodiment of a board heating module of the semiconductor package test apparatus 100. In particular, FIG. 8 is a perspective view of the board heating module 122b in FIG. 4B. FIG. 9 is an exploded perspective view of the heater module 142c in FIG. 8.

The board heating module 122b may include one heater module 142c and two heater modules 142a. The board heating module 122b may be connected to and on the base test board 116b. The board heating module 122b may include the heater modules 142a and 142c. The heater module 142a may include two heaters 146 on a heater module base 144a and separated from each other and a heat transferring member 150 on the heaters 146.

The heater module 142c may include twelve heaters 146 on a heater module base 144a and separated from each other, and a heat transferring member 150 on the heaters 146. Power lines 148 linked to the heater 146 and connected to the neighboring heater 146 may be on the heater module base 144a. The power lines 148 may be protected by a protection cover 158 on the heater module base 144a.

Figure 10:
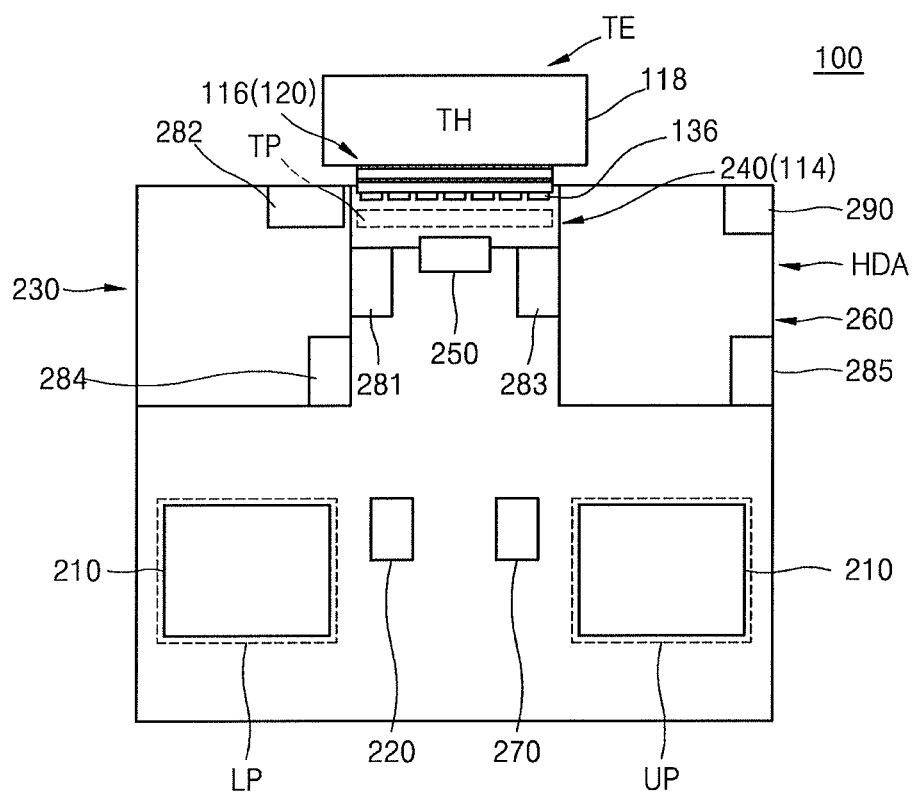
FIGS. 10 to 12 illustrate an embodiment of a semiconductor package test.
Figure 11:
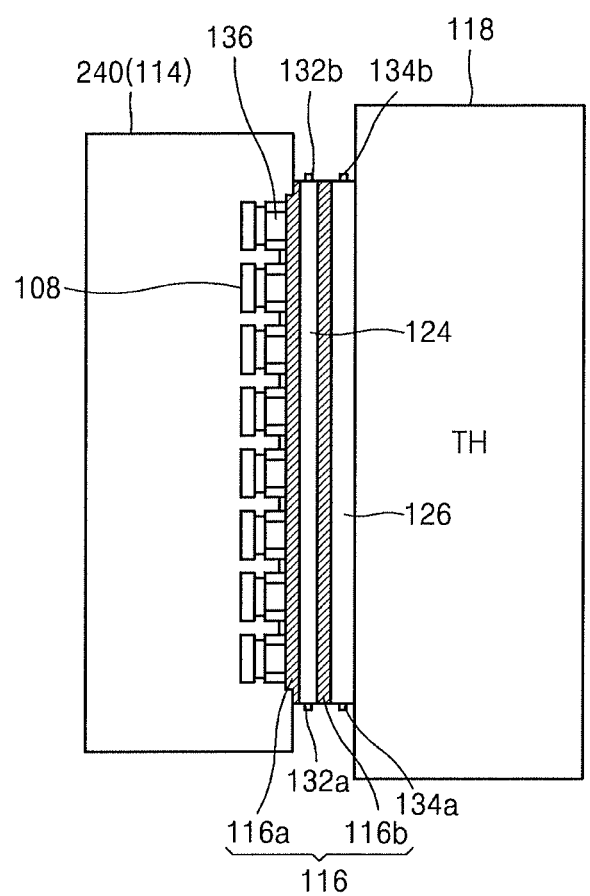
Figure 12:
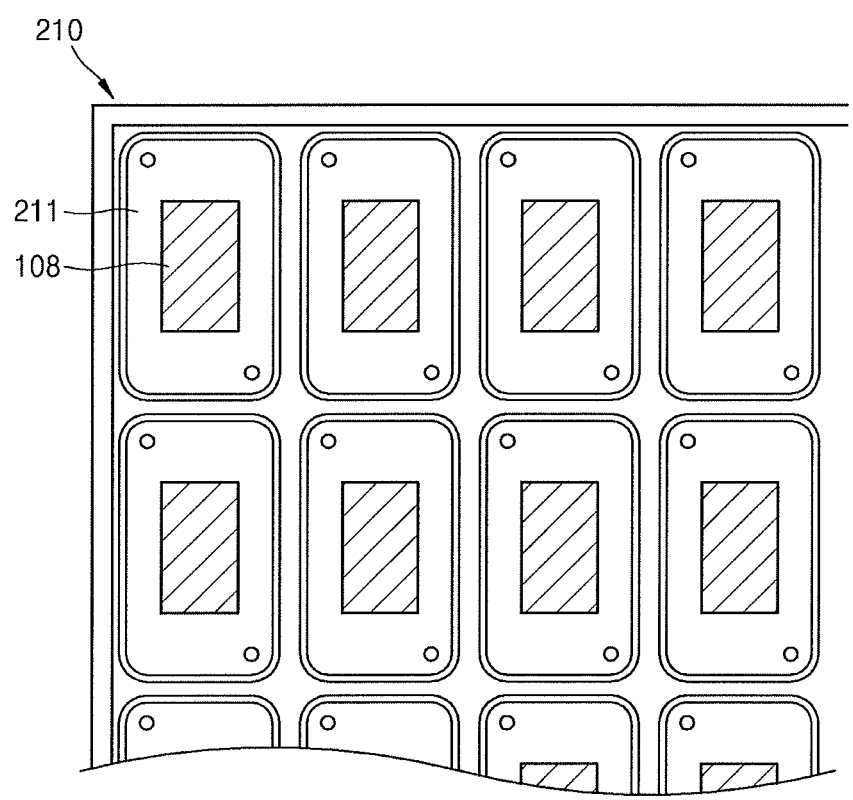

FIGS. 10 to 12 illustrate an embodiment of a semiconductor package test which, for example, may use the semiconductor package test apparatus 100. In particular, FIG. 10 is a plan view of the semiconductor package test apparatus 100 including a handler apparatus HDA, a tester TE, and board heating and cooling unit 120 for heating or cooling test board 116. FIG. 11 illustrates a one-side sectional view of a board heating and cooling auxiliary chamber 124, a board frost-removing main chamber 126, and the test board 116 of the tester TE corresponding to the board heating and cooling unit 120 in FIG. 10. FIG. 12 illustrates an enlarged plan view of a test tray 210 in FIG. 10.

The handler apparatus HDA may include the test tray 210, a loading apparatus 220, a soak chamber 230, a test chamber 240, a pressure apparatus 250, a desoak chamber 260, an unloading apparatus 270, temperature controlling apparatuses 181 to 185, and a controller 290.

Referring to FIG. 12, a plurality of inserts 211 may be on the test tray 210 and may move to a certain degree. The test tray 210 may circulate along a predetermined path, e.g., from the test tray 210 of a side of the loading apparatus 220 to the test tray of a side of the soak chamber 230, the test chamber 240, the desoak chamber 260, and the unloading apparatus 270.

The loading apparatus 220 loads the semiconductor package 108 on the test tray 210 at a loading position LP. The soak chamber 230 is provided to pre-heat or pre-cool the semiconductor packages 108 of the test tray 210, moved from the loading position LP after the semiconductor packages 108 are completely loaded, according to the testing environment condition.

The test chamber 240 is provided to test the semiconductor packages 108 of the test tray 210 that has been moved to a test position TP after being pre-heated or pre-cooled in the soak chamber 230. The test chamber 240 may be a package heating and cooling chamber 114 for heating and cooling the semiconductor packages 108.

The pressure apparatus 250 presses the semiconductor packages 108 of the test tray 210 on the test position TP in the test chamber 240 to a side of a test head 118 of the tester TE. In this regard, the semiconductor packages 108 of the test tray 210 are electrically connected to the tester TE and thus may be tested.

The desoak chamber 260 may return the temperature of the heated or cooled semiconductor package 108 of the test tray 210, that has been moved from the test chamber 240, to room temperature or another predetermined temperature. The unloading apparatus 270 classifies the semiconductor packages 108 on the test tray 210, which came to an unloading position UP after being removed from the desoak chamber 260, per test level and unloads the semiconductor packages 108 to an empty customer tray.

The temperature controlling apparatuses 281 to 285 may control an inner temperature of the soak chamber 230, the test chamber 240, and the desoak chamber 260. The temperature controlling apparatuses 281 to 285 may control an inner temperature of the test chamber 240. The temperature controlling apparatus 284 may control an inner temperature of the soak chamber 230. Thus, temperatures of the semiconductor packages 108 in the soak chamber 230 and the test chamber 240 may be assimilated to a temperature according to the test environment by the temperature controlling apparatuses 281 to 284. Also, the temperature controlling apparatus 285 may control an inner temperature of the desoak chamber 260. The controller 290 may control the temperature controlling apparatuses 281 to 285 and each of elements that correspond to the semiconductor package test apparatus 100.

The tester TE may include the test head (TH) 118 linked to the handler apparatus HDA. The test head TH 118 may be connected to a test board 116 having a test socket 136 in the test board 116. The test board 116 may include a main test board 116a including the test socket 136 and a base test board 116b spaced apart from one side of the main test board 116a. The test socket 136 may be electrically connected to the semiconductor package 108 that is supplied by the handler apparatus HDA.

The semiconductor package 108 may be linked with the test socket 136 of the test board 116 of the test head TH 118 by the handler apparatus HDA. The semiconductor package 108 may be in the test chamber 240. A high temperature or a low temperature of the semiconductor package 108 may be maintained by the temperature controlling apparatuses 281 and 283.

A board heating and cooling auxiliary chamber 124 may be on one side of the test board 116 that is linked to the semiconductor package 108. An inlet 132a and an outlet 132b, through which heating gas or cooling gas is supplied and discharged, are in the board heating and cooling auxiliary chamber 124 to control the temperature of the test board 116.

A set temperature set by the handler apparatus HDA and a test temperature of the semiconductor package 108 may be maintained, for example, to be the same. Further, a board frost-removing main chamber 126 may be at one side of the base test board 116. An inlet 134a and an outlet 134b, through which dry air is supplied and discharged, are in the board frost-removing main chamber 126 and thus may be supplied with dry air. The semiconductor package test apparatus 100 may remove frost from semiconductor package 108 when the semiconductor package 108 is tested at a low temperature.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The modules, units, controlling apparatuses, and other signal processing or control features of the embodiments described herein may be implemented in logic which, for example, may include hardware, software, or both. When implemented at least partially in hardware, the modules, units, controlling apparatuses, and other signal processing or control features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the modules, units, controlling apparatuses, and other signal processing or control features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a semiconductor package test apparatus includes a board temperature controlling apparatus for controlling a temperature of a test board so that a set temperature of a handler apparatus and a test temperature of a semiconductor package are maintained at predetermined temperatures, e.g., the same temperature. The test board includes a main test board including a test socket and a base test board spaced apart from a lower part of the main test board.

The board temperature controlling apparatus may include a board heating and cooling unit for heating or cooling the test board. The board heating and cooling unit may include a board heating module for directly heating the test board. The board heating and cooling unit may include a board heating and cooling auxiliary chamber that indirectly heats or cools the test board. The board temperature controlling apparatus may include a board frost-removing main chamber including the test board and may remove frost on a lower surface of the test board by injecting dry air to the board frost-removing main chamber.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor package test apparatus, comprising:
a handler including a first heater and cooler to heat and cool a semiconductor package;
a test board including main test board having a test socket and a base test board spaced from the main test board, the test board to test the semiconductor package connected to the test socket; and
a board temperature controller including a second heater and cooler to heat and cool the main test board.

2. The apparatus as claimed in claim 1, wherein:
the first heater and cooler is to heat or cool the semiconductor package to a first temperature, and
the second heater and cooler is to heat or cool the main test board the first temperature.

3. The apparatus as claimed in claim 1, wherein the first heater and cooler includes a package heater coupled to the semiconductor package to directly heat the semiconductor package.

4. The apparatus as claimed in claim 1, wherein the first heater and cooler includes a chamber in which the semiconductor package is to be indirectly heated or cooled.

5. The apparatus as claimed in claim 1, wherein the second heater and cooler is on the base test board and includes a board heater coupled to a lower surface of the main test board to directly heat the main test board.

6. The apparatus as claimed in claim 5, wherein the board heater includes:
a body coupled to the base test board, and
a plurality of heaters on the body and spaced apart from one another.

7. The apparatus as claimed in claim 6, wherein each of the plurality of heaters includes at least one heater and a heat transfer area contacting the main test board on the at least one heater.

8. The apparatus as claimed in claim 1, wherein the second heater and cooler includes a chamber between the base test board and the main test board and wherein the main test board is to be indirectly heated and cooled in the chamber.

9. The apparatus as claimed in claim 8, wherein a board gas supplier and discharger to supply and discharge a heating gas or a cooling gas and wherein the board gas supplier and discharger is coupled to the chamber.

10. The apparatus as claimed in claim 8, wherein:
the board temperature controller includes a main chamber to remove board frost comprising the base test board, the main test board, and the chamber, and
the main chamber is connected to a board air supplier that is to supply air to remove frost on a lower surface of the base test board.

11. A semiconductor package test apparatus, comprising:
a first heater and cooler to heat and cool a semiconductor package;
a test board at a lower part of the semiconductor package, the test board including a main test board having a test socket to connect to the semiconductor package and a base test board spaced from a lower part of the main test board; and
a second heater and cooler between the main test board and the base test board, the second heater and cooler to heat or cool the main test board to a first temperature.

12. The apparatus as claimed in claim 11, wherein the second heater and cooler includes a heater on a lower surface of the main test board to directly heating the main test board.

13. The apparatus as claimed in claim 12, wherein the heater includes:
a body connected to the base test board;
a plurality of heaters spaced apart from each other on the body, each of the heaters including at least one heater; and
a heat transfer area on the at least one heater to contact the main test board.

14. The apparatus as claimed in claim 11, wherein the second heater and cooler includes a chamber to receive a heating gas or a cooling gas to indirectly heat or cool the main test board.

15. The apparatus as claimed in claim 11, further comprising a main chamber including the base test board and to receive air to remove frost from the base test board.

16. An apparatus, comprising:
a link to a semiconductor package;
a first adjuster to heat and cool the semiconductor package; and
a second adjuster to control a temperature of a test board for testing the semiconductor package, wherein:
the test board is coupled to the semiconductor package through the link, and
the second adjuster is to offset a change in temperature of the test board during testing.

17. The apparatus as claimed in claim 16, wherein the second adjuster includes at least one of a heater to heat the test board to offset the change in temperature or a cooler to cool the test board to offset the change in temperature.

18. The apparatus as claimed in claim 16, wherein the second adjuster is to heat or cool the test board to substantially a same temperature as the semiconductor package.

19. The apparatus as claimed in claim 16, wherein the second adjuster is to directly heat or cool the test board to offset the change in temperature.

20. The apparatus as claimed in claim 16, wherein the second adjuster is to indirectly heat or cool the test board to offset the change in temperature.

* * * * *